United States Patent
Ter Meulen et al.

(10) Patent No.: US 12,128,604 B2
(45) Date of Patent: Oct. 29, 2024

(54) APPARATUS FOR A ROLL-TO-PLATE IMPRINTING PROCESS COMPRISING A PLATE CARRIER WITH CAVITY

(71) Applicant: MORPHOTONICS HOLDING B.V., Veldhoven (NL)

(72) Inventors: Jan Matthijs Ter Meulen, Eindhoven (NL); Bram Johannes Titulaer, Veldhoven (NL); Adrianus Johannes Van Erven, Casteren (NL)

(73) Assignee: MORPHOTONICS HOLDING B.V., Veldhoven (NL)

( * ) Notice: Subject to any disclaimer, the term of this patent is extended or adjusted under 35 U.S.C. 154(b) by 265 days.

(21) Appl. No.: 17/770,027

(22) PCT Filed: Nov. 11, 2020

(86) PCT No.: PCT/EP2020/081765
§ 371 (c)(1),
(2) Date: Apr. 18, 2022

(87) PCT Pub. No.: WO2021/094375
PCT Pub. Date: May 20, 2021

(65) Prior Publication Data
US 2022/0396026 A1    Dec. 15, 2022

(30) Foreign Application Priority Data

Nov. 12, 2019  (EP) .................... 19208428
Nov. 12, 2019  (EP) .................... 19208429

(51) Int. Cl.
*B29C 59/04*  (2006.01)
*B29C 59/00*  (2006.01)

(52) U.S. Cl.
CPC .......... *B29C 59/046* (2013.01); *B29C 59/002* (2013.01); *B29K 2995/0046* (2013.01)

(58) Field of Classification Search
None
See application file for complete search history.

(56) References Cited

U.S. PATENT DOCUMENTS

2007/0243281 A1    10/2007  Hasegawa
2009/0273119 A1    11/2009  Imai
(Continued)

FOREIGN PATENT DOCUMENTS

JP    2016-162870 A      9/2016
JP    2016197672 A  *  11/2016
(Continued)

OTHER PUBLICATIONS

Japanese Office Action received for JP Application No. 2022-523189 on Jul. 29, 2024.

*Primary Examiner* — Yung-Sheng M Tsui
(74) *Attorney, Agent, or Firm* — Merchant & Gould P.C.

(57) ABSTRACT

The invention pertains to an imprinting apparatus for a roll-to-plate process comprises a flexible master with an imprint pattern, a plate carrier and a substrate and curable imprint resin. The substrate is located on the plate carrier. The flexible master carries an inverse structure (imprint pattern), which is required for the desired product. The curable resin (also mentioned as lacquer) is placed on the substrate and/or the flexible master. During the imprinting process the flexible master is pressed upon the substrate with the curable resin in between. The plate carrier comprises a cavity in which the substrate is located. At least one substrate side-face is at least partially unenclosed by the cavity. A further idea of this invention pertains to two roll-to-plate imprinting processes.

15 Claims, 11 Drawing Sheets

(56) References Cited

U.S. PATENT DOCUMENTS

2014/0191441 A1 7/2014 Mori
2016/0257062 A1 9/2016 Ishikawa

FOREIGN PATENT DOCUMENTS

JP 2016207950 A 12/2016
WO 2016170729 A1 10/2016

* cited by examiner

APPARATUS FOR A ROLL-TO-PLATE IMPRINTING PROCESS COMPRISING A PLATE CARRIER WITH CAVITY

The Invention pertains to an imprinting apparatus for a roll-to plate process.

Imprinting apparatus for a roll-to-plate process are known and comprise a roller, a flexible master with an imprint pattern, a plate carrier and a substrate and curable imprint resin. The substrate is located on the carrier material. The flexible master carries an inverse structure (imprint pattern), which is required for the desired product. The curable resin (also mentioned as lacquer) is placed on the substrate and/or the flexible master. During the imprinting process the flexible master is pressed by use of a roller upon the substrate with the curable resin in between. After curing, the resin is solidified, e.g. by heat and/or UV, and the flexible master is removed, resulting in a textured area on the substrate Known prior art for a roll-to-plate imprinting apparatus is for example described in WO 2016128493.

In document US 2016/257062 an imprinting device is disclosed in which a flexible mold is hold by vacuum on a surrounding stage and pressed upon a substrate comprising a curable resin (see FIG. 1) in order to achieve a uniform transfer regardless of the thickness of the substrate. This document also discloses a plate on the stage, which forms a kind of cavity.

Document JP 2016 197672 discloses an imprinting apparatus and an imprinting method for preventing resin from flowing. On a stage a substrate is positioned, whereby an elastic member is disposed on the stage to form a gap portion. The gap portion should surround the substrate and according to FIG. 1 the substrate is embedded in the elastic material (elastic member is formed around the substrate).

The imprint quality and the residual layer thickness of the textured area on the substrate depends on process settings like the imprint velocity and the imprint pressure. To obtain a thin residual layer, a higher imprint pressure is applied on the roller. This imprint pressure is applied at both sides of the roller. Due to the discontinuous nature of the process and having a line pressure, it is complex to achieve a uniform imprint pressure over the entire imprinted substrate area. A non-uniform pressure of the roller will influence the pressure of the flexible master upon the curable material of the substrate and results in a property variation of the obtainable product. For the wafer-scale imprint process this uniformity problem is solved with either a full surface imprint or a varying and well-controlled pressure over the imprint area, with a flat substrate and mask holder (chuck). The roll-to-roll replication process is a continuous process over a squared surface.

In detail there are two main process situations, resulting in a non-uniform pressure.

With the substrate placed on the carrier, the roller will have a transition area at the first and last contact point of the substrate. The roller pressure will be exerted and divided over the lower carrier surface and the higher substrate surface. Hereby the imprint pressure will be higher at the start and end of the substrate, especially for thicker substrates.

The line pressure per unit area of the imprint roller will vary over the substrate, if the substrate has a varying width. Due to the varying width the same line pressure will be exerted over a broader or smaller area.

Therefore, by using such roll-to-plate apparatuses it is generally difficult to apply a uniform pressure over the entire area of the substrate.

It is thus the aim of the invention to compensate or at least to minimize the disadvantages of the prior art roll-to-plate imprinting apparatus, whereby at the same time the handling properties—for example inserting the substrate—and error rate during the process should not be influenced.

This aim is achieved with an imprinting apparatus for a roll-to-plate process, whereby the plate carrier has at least one cavity wherein a substrate is locatable and whereby at least one side-face of the substrate is at least partially unenclosed by the cavity.

At least one side-face means for a square form of the substrate at least one side-face of the substrate is at least partially unenclosed by the cavity. Preferably two side-faces, and most preferred two side-faces arranged opposite to each other are unenclosed if a square substrate is used. Preferably, the unenclosed side-face, or the unenclosed side-faces is or are in imprinting direction. If a round substrate is used the substrate has only one side-face which is at least partially unenclosed by the cavity. The term "at least partially unenclosed" means that at least 5%, more preferred at least 20% and most preferred at least 50% of the side-face is unenclosed by the cavity. For a square substrate preferably 10%, more preferred 50% and most preferred 100% of one side-face is unenclosed by the cavity.

The term "unenclosed" means that no cavity side wall is present. A cavity which has a larger dimension than a substrate, whereby a small gap between cavity side wall and substrate is present, ensuring easy placement of the substrate in the cavity, is not to be understood by the term "unenclosed". Such easy handling gap can have a width of tens of microns up to hundreds of microns.

Due to a cavity, which encloses the substrate not completely, the contact of the flexible master with the plate carrier and the substrate can be made constant during the imprinting process. If a pressure is applied at the sides of the roller for pressing the flexible master on the substrate, this pressure is distributed over the part (length) of the roller, which is in contact with the substrate. This means for example for a round substrate, the pressure in the beginning and at the end will be higher. If the round substrate is arranged in a round cavity, the pressure will be uniformly distributed over the substrate and cavity side. This is amplified if the cavity sides have same height as the substrates and if the total length of contact of the roller on the substrate and carrier plate is always the same.

However, the carrier plate does not need a full enclosure, but can have openings and can have various shapes compared to the form of the substrate. Thus, the form of the substrate becomes more independent from the form of the cavity, so far, the cavity is designed as claimed in the invention.

In addition, due to the fact that the cavity does not enclose the substrate completely a kind of outward flow is created. Redundant uncured resin can flow out during the imprinting process and does not flow over the substrate.

Furthermore, due to the fact that the substrate is not fully enclosed by the cavity, an access to the substrate is created. This access can be used to reduce the effect of oxygen inhibition of the acrylate-resin, resulting in not fully cured resin. This oxygen inhibition takes place if the resin is exposed to oxygen, while being cured by UV light. The resin will remain tacky on the surface, which is unwanted for handling and downstream process steps. The open-area of the cavity, which creates the access to the substrate, can reduce this effect by insertion a gas to the substrate, for example by replacing the oxygen by nitrogen or other inert gasses. Hereby the substrate is surrounded by for example nitrogen, inserted through the access. In this case the resin and also the resin which is not fully trapped between the substrate and flex stamp during the curing step, will fully cure.

Further effect of the cavity is that along the roller, perpendicular to the imprinting direction, the total length of the contact area of roller, substrate and carrier plate is always equal and independent of the design of the substrate.

In the at least one cavity at least one substrate is locatable. If the substrate comprises more than one cavity each cavity can comprises one or more substrates.

At least one cavity means that the plate carrier may comprises two or more cavities. However, in the following the term "cavity" is used even if a plurality of cavities is encompassed.

A plate carrier according to the invention is a kind of plate comprising a carrier surface, whereby the area of the carrier surface is larger than the thickness of the plate perpendicular to the carrier surface. The width and the length of the plate carrier is larger than the area of the substrate.

Also the substrate has substrate surfaces which are larger than the thickness of the substrate perpendicular to the substrate surfaces. The substrate has two substrate surfaces, which are arranged parallel and on top of each other.

Perpendicular to the substrate surfaces the substrate has side-faces. The curable lacquer is present on one substrate surface.

The term "flexible master" is used for any device which is flexible and suitable as carrier for an imprinting pattern. Preferably, the flexible master is a flexible stamp or a flexible nickel shim.

The term "cavity" means any specific reduction or elevation of at least one segment of the plate carrier, resulting in a storage area for the substrate on the plate carrier. This includes for example a recess within the plate carrier comprising one or more side walls (see FIG. 6b) as well as a gap within the plate carrier in form of a groove (see FIG. 7). The storage area is part of the plate carrier and the area in which the substrate is located on or in the plate carrier.

Due to the at least one cavity the roller with flexible master (and the inverse imprint pattern) is guided over the substrate while the roller and edges of the flexible master move over the plate carrier. Due to this the pressure of the flexible master upon the substrate is equally divided over the substrate.

It should be clear that on top of the substrate surface (or on top of the flexible master) a curable resin (also named lacquer) is present and the flexible master prints structures into this lacquer resulting in the (inverse) imprint pattern on the substrate. When, in the following it is mentioned that the flexible master comes into contact with the substrate it is meant that the inverse imprinting pattern of the flexible master is transferred into the resin in between the flexible stamp and the substrate. Regarding the imprinting process and the further apparatus means of the imprinting apparatus reference is made to the document WO 20181011208.

In one preferred embodiment the cavity has a height which is approximately equal to the substrate thickness (see FIG. 5). In one further preferred embodiment the at least one cavity has a height which is approximately equal to the sum of the substrate thickness and the curable resin onto the substrate. The term "equal" means that the cavity height differs by less than 200 µm, preferred less than 100 µm, more preferred by less than 50 µm and most preferred by less than 20 µm from the substrate thickness. For the understanding— during the imprint process the substrate has a propagation direction relative to the position of the roller and the thickness of the substrate is perpendicular to that propagation direction. For the understanding—this means, the substrate has a surface area which is imprinted, the thickness of the substrate is perpendicular to the imprint surface. In this preferred embodiment it is ensured that the surface of the flexible master comes into contact with the substrate and the upstanding sides of the plate carrier, resulting in a constant pressure on the substrate.

In one preferred embodiment the cavity has one or more sidewalls and the sidewalls have a height which is approximately equal to the sum of the substrate thickness and the thickness of the flexible master including the imprinting pattern. Also, in this embodiment it is ensured that the flexible master with inverse imprinting pattern has maximally same width as the substrate and is thereby not in contact with upstanding side parts of the plate carrier, whereby a constant pressure over the contact area is ensured. In a preferred embodiment the width of imprinting pattern is smaller than the width of the cavity.

In both above mentioned embodiments the full surface contact with constant pressure over the contact area between substrate and flexible master improves the imprinting result significantly. Thus, the product quality of the obtained product is higher, having a better controlled layer thickness uniformity.

In one preferred embodiment the plate carrier comprises a compensating material. Preferably the compensating material is an additional layer comprising a fluid (like gas or liquid) or a flexible material. The plate carrier is preferably mainly made from an inflexible material like glass, whereby an additional compensating material is added.

The term "compensating material" means every material, which has reversible pressure compensating properties. In one preferred embodiment the compensating material is a fluid. Preferably, the fluid is present in form of an additional layer, which is in direct conformal contact to the plate carrier. The term "direct contact" means, that the additional layer is in a mechanically contact to the plate carrier. For example, the additional layer is placed between the substrate and the plate carrier. In one preferred embodiment the fluid is a gas or a liquid. As gas Argon, Nitrogen or air. Water, oil, an acrylate fluid or a curable acrylate fluid is a preferred liquid medium. In one further preferred embodiment the fluid is a viscoelastic fluid. Preferably the plate carrier comprises a fluid system with which the fluid is poured into the additional layer (like a cushion for the substrate).

In another preferred embodiment the compensation material is a flexible material. The term "flexible" means that the material can be reversible compressed. The material can be bent easily without breaking. This means that the flexible material is elastic in comparison with glass or metal. Preferably the flexible material has a Young's Modulus between 0.1 Giga Pascal (GPa) and 10 Giga Pascal (GPa), more preferred a Young Modulus between 0.5 Giga Pascal and 5 Giga Pascal measured according to ASTM E111. As example the flexible material can be rubber, elastomers, fiber materials, EPDM, polychloroprene, polyurethane or other plastics or mixtures of the above-named materials.

Within this application a material is called a rigid material if it has a Young's Modulus above 50 GPa measured according to ASTM E111.

In one further preferred embodiment the compensating material has a shore value of below 80 Shore A measured according to ASTM D2240.

In one preferred embodiment the plate carrier and the cavity are made as one pieces. This means the at least one cavity is part of the plate carrier and created by the removal of material of the plate carrier. The one pieces embodiment has the advantage that no contamination gathering in a seam of the plate carrier is possible.

Preferably, the cavity is located within the compensating material. In this preferred embodiment the cavity is a recess within the compensating material. In one preferred embodiment the cavity is part of the compensating material. It is also preferred when the compensating material, for example a flexible mat, is laid down in the cavity of the plate carrier. The flexible mat may go beyond the cavity or is bound by the cavity.

For this embodiment the plate carrier may be made from rigid material and the compensating material is the flexible mat.

In the case of a fluid as compensating material, the substrate is placed on a bed of gas or bed of liquid. It is preferred that either the plate carrier comprises a fluid flow system to create the gas bed or liquid bed within a cavity or the cavity itself comprises a fluid flow system. In both embodiments the plate carrier may be present in a first plat carrier part and a second plate carrier part.

In the roll-to-plate imprinting process large area surfaces of the substrate can be imprinted. These large surfaces can be transported only by the use of large plate carriers. The larger the plate carrier size, the more complex is the making of a flat surface of the plate carrier. If the plate carrier is not perfectly flat, the pressure on the substrate (which is located above the plate carrier) will be locally different. This will result in local thickness variations at the end product. In addition, if the backside of the (large) substrate (which is in contact with the plate carrier) is not uniformly flat due to thickness variations, defects or pollution (for example a dust particle), there will be also pressure variations during the imprinting. Furthermore, also non-uniformities of the imprint roller result in pressure variations during the imprinting process. This all will result in a locally thinner or thicker residual layer thickness. A non-uniform backside surface of the substrate is thus visible at the front side of the substrate—this means the lacquer side—and influences the quality of the imprinted end product. Due to the use of a compensating material (for example a flexible material) the unevenness is compensated.

In one further preferred embodiment the plate carrier is made of at least two parts. Preferably, at least one of the two parts of the plate carrier is made of or creates the compensating material. For example, the plate carrier may have an inflexible material (glass) as a first part, and a flexible material (as one embodiment for the compensating material) as the second part. In another example the first plate carrier part has a fluid flow system, to create the air bed or liquid bed as compensating material and a second plate carrier part of the plate carrier is made of a rigid material or a flexible material creating the cavity. The cavity may be part of the first part or the second part or extend over both parts. Preferably, the plate carrier is made of a first part of a glass or metal material and the second plate carrier part is made of a flexible material, whereby the cavity is part of the second part. As an example, the cavity is fully embedded in a flexible material of the second plate carrier part of the plate carrier. In another example the second plate carrier part contains a fluid flow system. The system is preferably located within the cavity. Also, in this embodiment the material of the first and second plate carrier part is the same or different. Due to the use of two parts, whereby both parts may be made of different materials, the stability of the plate carrier will not be reduced even if the flexibility is increased.

Preferably, the at least two parts of the plate carrier are reversibly connectable with each other. "Reversibly connectable" means that both parts can be separated from each other without destroying any one of the parts. The connection between both parts can be achieved via an adhesive surface on one or both parts, through a glue and/or through a plug connection (like a rail system or positing pins) and/or via a screw system and/or magnetically or a combination of the above-named systems. Due to the two-part construction of the plate carrier, it is easy to adapt the plate carrier to different substrate thicknesses (lacquer thicknesses) or flexible master thicknesses. In addition, by using a compensating material as one part, this part has a higher wear resistance than a part made of an inflexible material. Thus, only one part of the plate carrier has to be replaced (instead of a complete plate carrier).

Preferably, the flexible material is a rubber or a plastic foil. As an example, the flexible material can be rubber, elastomers, fiber materials, EPDM, polychloroprene, polyurethane or other plastics or mixtures of the above-named materials.

In one preferred embodiment a vacuum system is located within the cavity of the plate carrier. The cavity may have, for example, vacuum holes through which a lower pressure within the cavity can be generated. This will hold the substrate at a defined position within the cavity and will thus improve the imprinting process. The vacuum holes are not comparable with the fluid flow system. The vacuum holes create a kind of under pressure (to hold the substrate on place) whereby the fluid flow system creates a kind of fluid bed for the substrate.

In one further preferred embodiment the plate carrier comprises a placement system. The placement system comprises preferably lifting fingers by means of which the substrate can easily be placed on the carrier plate, for instance by use of a robot. In another preferred embodiment the carrier contains positioning pins (also named alignment pins or pushers) to position by which the substrate can be placed at a preferred position, or always at the same position in respect to a reference point. As a result, the process accuracy can advantageously be increased, because the imprinting process will start always at the same point of a substrate.

In one preferred embodiment the cavity equals the form of the substrate. "Equals the form" in this context means, that the cavity is not round, for example, and the substrate is angular. Preferably, the one or more sidewalls of the cavity form a kind of pocket in which the substrate can be inserted. In this embodiment the substrate is protected on selected side-faces of the substrate via the plate carrier during the imprinting process. It is also possible to dimension the cavity in such a way that the substrate lies in a form-fit way within the plate carrier and thus to avoid slippage during the imprinting process. However, it is also conceivable that the cavity is formed as a kind of wide groove extending over the entire carrier. Hereby the cavity opening (unenclosed part of the substrate side-faces) can be in-line with the imprint direction or perpendicular to the imprint direction. Moreover, a combination of both can be made creating a squared inner cavity.

In a further preferred embodiment, the cavity has raised sidewall-ends. This means the height of at least one sidewall-end of the cavity is increased at the end of the substrate. Due to this the roller is lifted at the end of the imprint process, reducing the imprint pressure and thereby preventing or reducing the overflow of lacquer at the substrate edge. In a more preferred embodiment, the substrate has two raised sidewalls.

In a further preferred embodiment, a foil is placed on top of the plate carrier and extends within the cavity. The substrate will be placed on the foil in the cavity. The foil protects the plate carrier and the cavity against contamination and/or prevents the substrate from slipping during the process and/or influences the refection index of the substrate.

In addition, a further idea pertains to a roll-to-plate process, whereby a substrate is located within a cavity of a plate carrier and a flexible master with inverse structure is pressed on the substrate, whereby the cavity height is adapted to match the height of the substrate and/or to match the height of the flexible master and the substrate whereby the substrate is located within the cavity in such a way that at least one substrate side-face is at least partially unenclosed by the cavity.

All embodiments mentioned for the imprinting apparatus are also applicable to roll-to-plate processes In the following the idea of this invention is further described by figures.

FIG. 1 shows an imprint setup and imprint process relevant to the invention.

Figure 1:
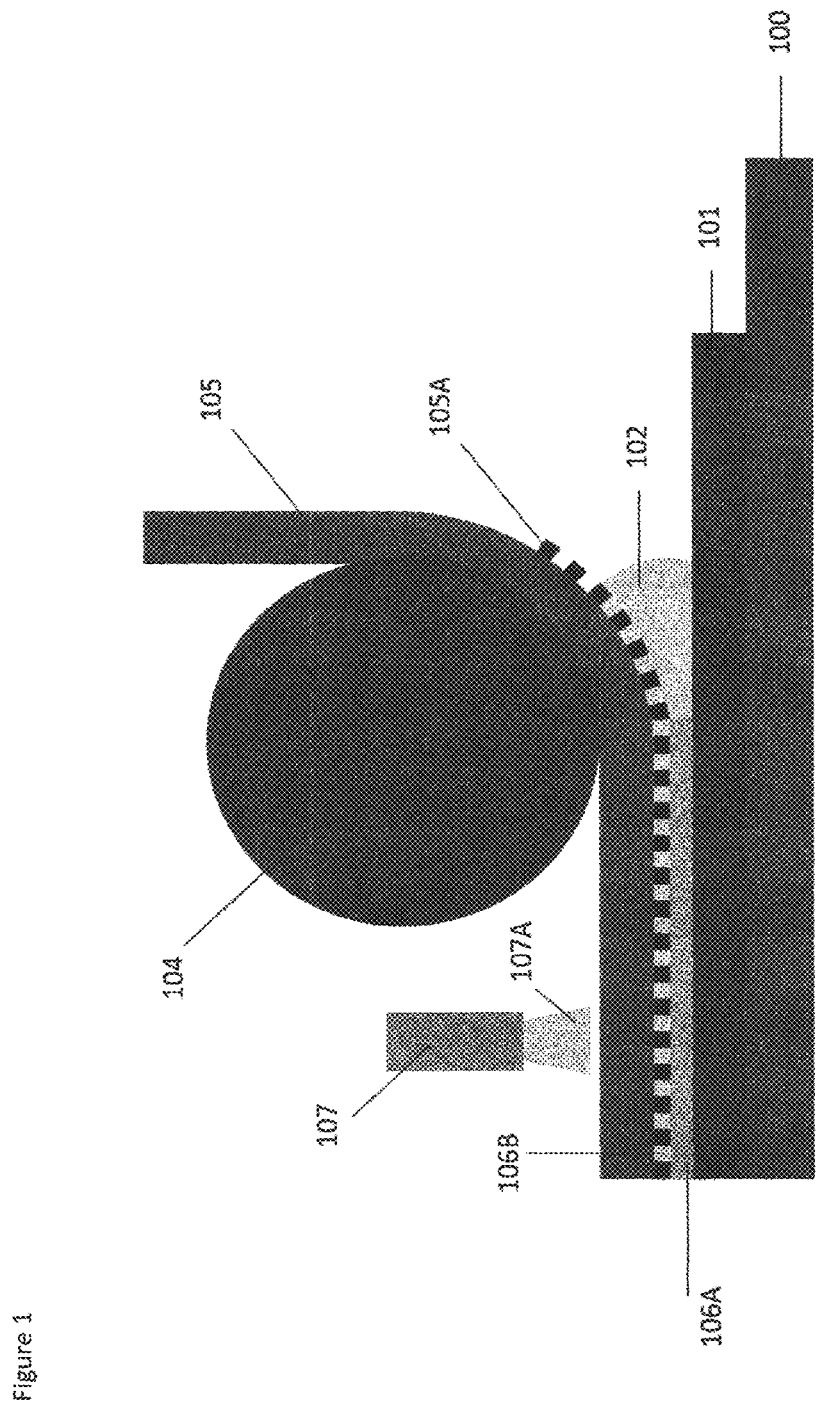
FIG. 1 shows schematically an imprint process.

A flexible master 105, having an imprinting pattern 105A with an inverse structure (negative) 105A as required for the product, is pressed upon a substrate 101 in a curable resin 102 by use of a roller 104. The substrate 101 is a plate—for example but not limited made of rigid glass—and can have different shapes. This substrate 101 is placed on a plate carrier 100 to give counter pressure and possibly for transportation. The plate carrier 100 can be, amongst others be made of glass or a metal. After curing the curable resin 102 (lacquer) by use of UV light 107A from the UV-light source 107, the flexible master 105 is removed and the cured resin 102, having the required product texture 106B and residual layer 106A underneath, is transferred on to the substrate 101.

Figure 2:
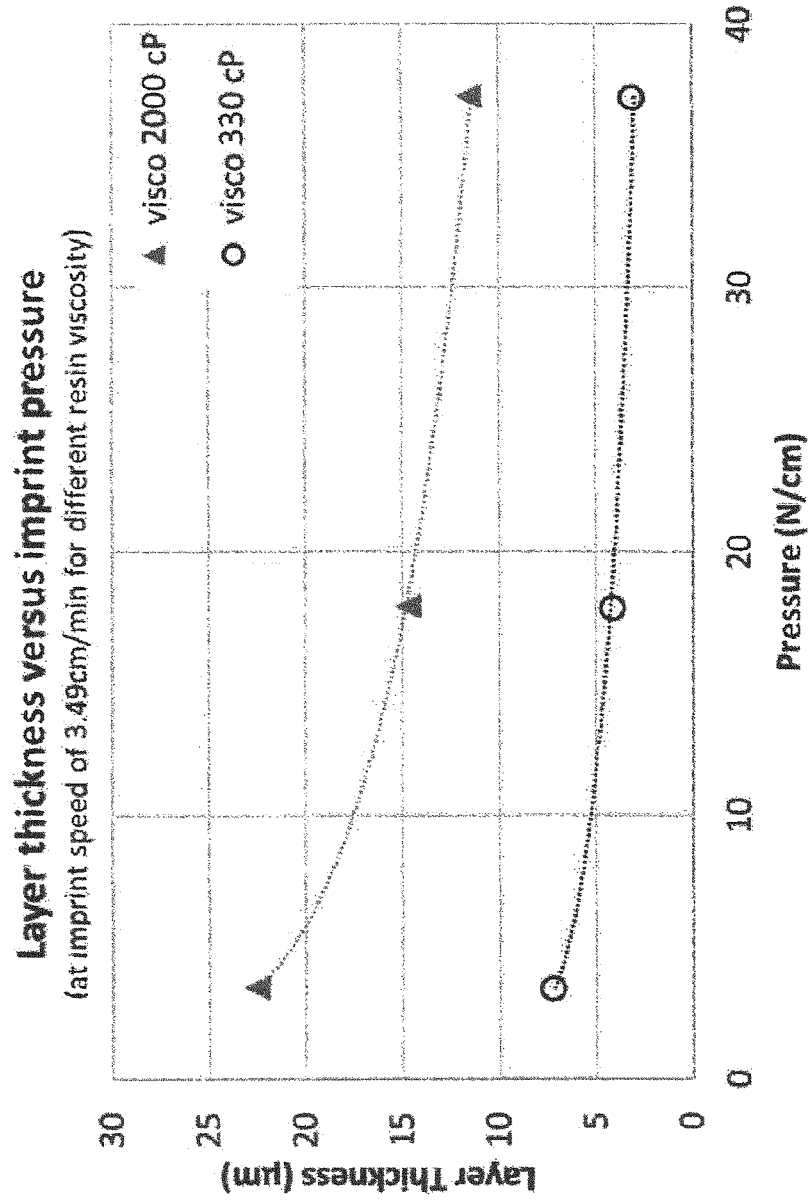
FIG. 2 shows a measured correlation between imprint pressure and layer thickness

The height of the curable resin 102 depends, among others on the imprint pressure. This height is the sum of the product texture 106B and the residual layer 106A. The residual layer 106A will have same texture height independent of the imprint pressure. The thickness of the residual layer 106B will be reduced with an increase of the imprint pressure. This correlation is shown in FIG. 2. The residual layer thickness will apart from the imprint pressure, also depend on the imprint speed and viscosity of the resin. Within FIG. 2 the correlation between the imprint pressure and the layer thickness (residual layer and product texture) is shown for two different resin viscosities imprinted at a speed of 3.49 cm/minute. This FIG. 2 shows that if the imprint pressure is increased from 10N/cm to 20N/cm, the layer thickness is reduced from around 5.5 micron to 4 micron for a standard resin viscosity of 330 cP.

Figure 3:
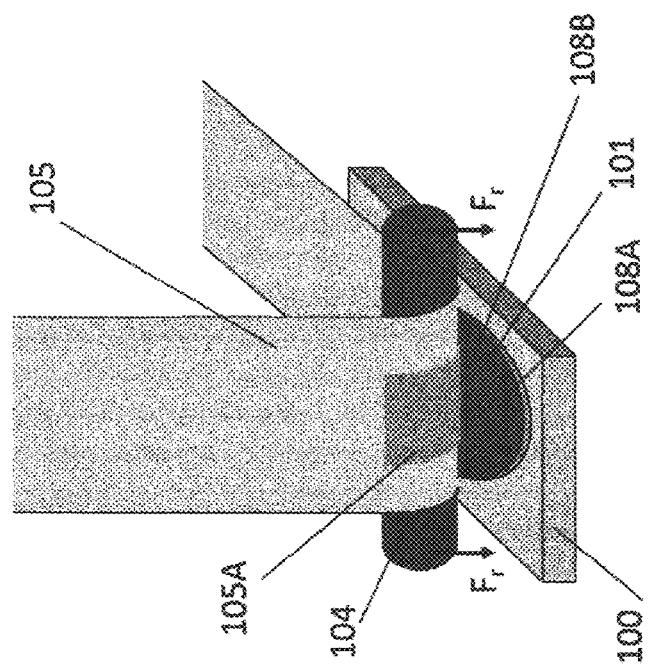
FIG. 3 shows schematically an example of a varying substrate width which can lead to a varying imprint pressure.

In a roll-to plate imprinting process the roller 104 is larger compared to the substrate size, as shown in FIG. 3. An imprint roller force $F_r$ is exerted at the sides (edges) of the roller 104. For a stiff roller this total force of $2*F_r$ is equally divided on the imprint contact surface. If the width of the substrate 101 is small the line pressure (per unit or per cm) 108A will be higher, compared to a broader substrate width resulting in a lower line pressure 108B. Due to this pressure variation on the substrate 101 the imprinting pattern 105A of the flexible master 105 is not uniformly copied within the lacquer on the substrate 101. The residual layer thickness might vary or even air bubbles might be trapped.

Figure 4:
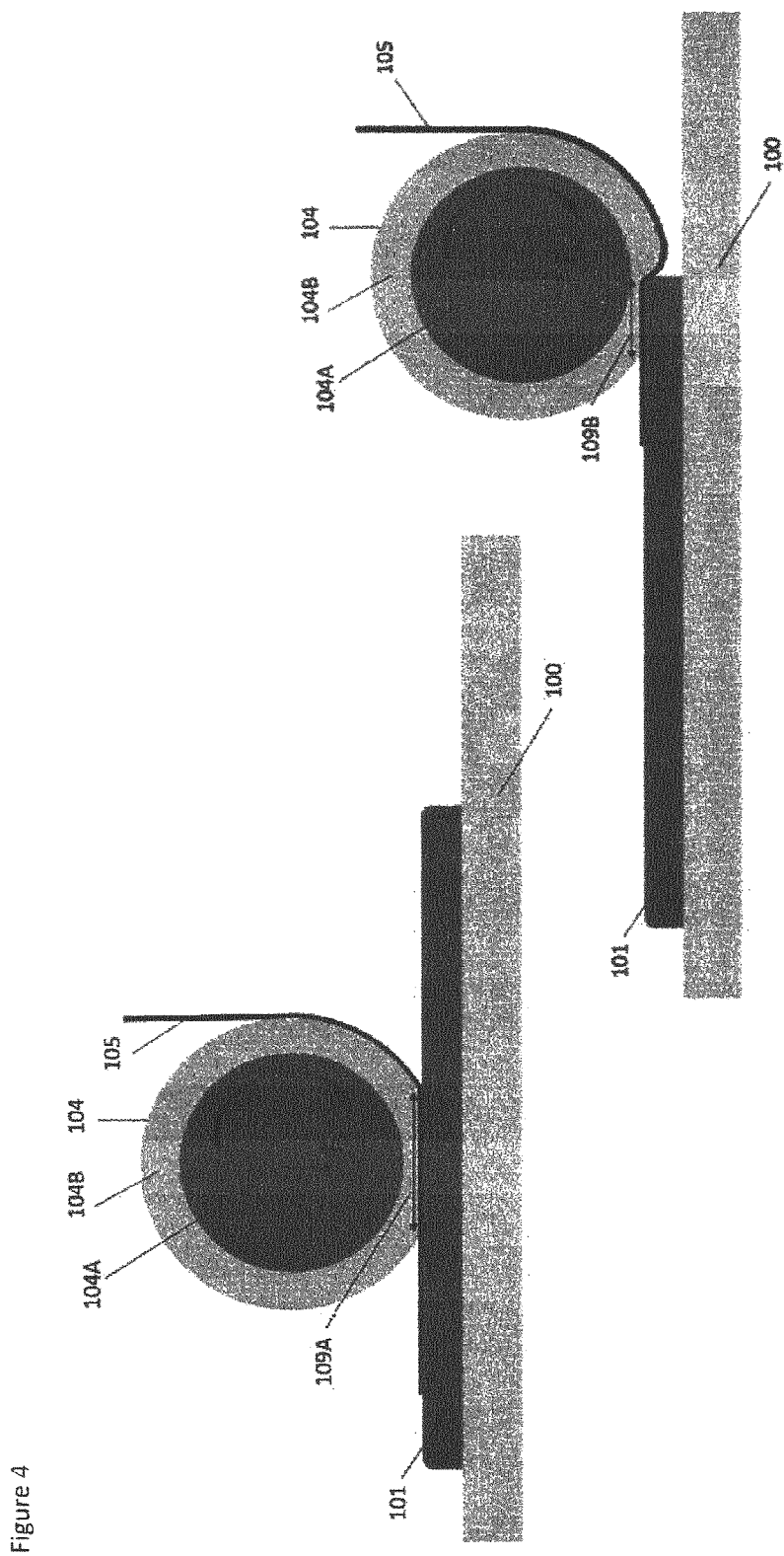
FIG. 4 show schematically an imprint pressure at the center compared to a pressure at the edge of the substrate.

FIG. 4 shows the varying imprint pressure at the end of the imprint process, at the edge of the substrate 101. A similar problem occurs at the front of the imprint process at the substrate front. In both front or end situations the roller 104 is pressed with a roller force $F_r$ on the substrate 101 with a flexible master 105 in between. The roller 104 has a rigid core 104A and a softer compressible outer layer 104B. Because the outer layer is soft, the roller 104 will be compressed due to the roller pressure and the roller contact surface 109A will be widened. This roller contact surface 109A on the substrate 101 will be smaller compared with the case the roll 104 is pressed on to the roller contact surface 109B at the end of the substrate 101. In this case the force remains the same, but will be carried out over a smaller contact area of substrate 101. With a smaller roller contact surface 109A the line pressure will be increased, resulting in a lower residual layer thickness.

Figure 5:
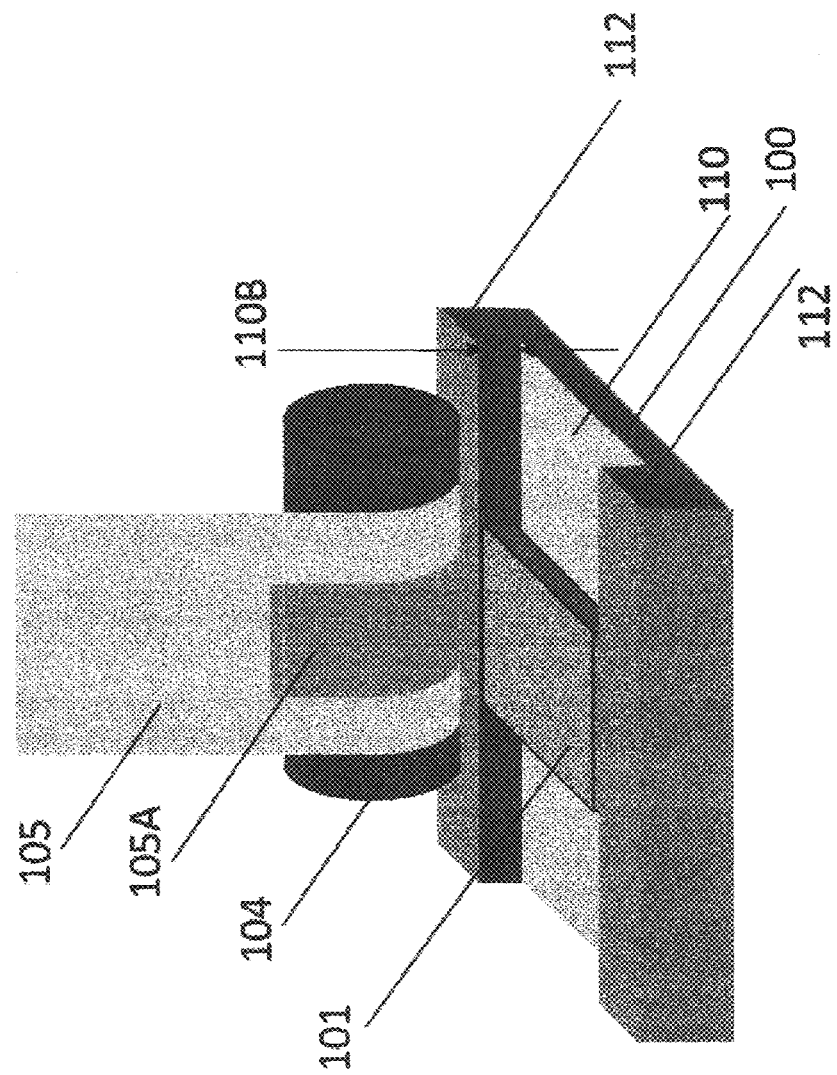
FIG. 5 shows schematically a plate carrier comprising a cavity.

To solve the varying pressure at the front and end of the substrate 101 as well as due to a varying substrate width, it is proposed that the plate carrier 100 contains a cavity. This is shown in FIG. 5, the plate carrier 100 comprises two raised sidewalls 112, creating a cavity 110 in which the substrate 101 is located. Due to the upstanding carrier sidewalls, at the front and/or at the end of the substrate 101, the pressure will be more uniformly distributed when the roller transitions from the upstanding carrier sides to the front and/or end of the substrate 101 during the start and stop of the imprint process. Hereby the pressure will become uniform over the start and/or stop of the imprint process. Note that already one raised sidewall at the front or at the end of the substrate is beneficial to create a uniform pressure at the start or stop of the imprint process. The cavity height 110B has preferably a height difference of below 200 micron compared to the substrate thickness, more preferably below 100 micron and most preferably below 50 micron. The cavity 110 does not surround the substrate 101 completely. According to the embodiment of FIG. 5 two side-faces of the substrate 101 are not enclosed by the cavity 110. The cavity 110 has an open area, in which at least one side-face of the substrate 101 is at least partially unenclosed by the cavity 110. Due to this the insertion or the removal of the substrate 101 into the cavity 110 is more simplified. Further one, the same cavity 110 is usable for square substrates having different width without any quality reduction during the imprinting process. The form of the cavity 110 becomes more independent, if the cavity 110 does not surround the substrate 101 completely. In one embodiment the material of the raised sidewalls 112 and/or the plate carrier 100 are a compensating material. This can be a flexible material or a fluid material. In the case of a fluid material, the plate carrier 100 preferably will have an air flow system or a liquid flow system integrated.

In one more preferred embodiment the raised sidewalls 112 are removable (detachable) located on the substrate 101 and designed to be connectable to the substrate. The substrate 101 and the raised sidewalls 112 create together a more uniform support.

Preferably, the substrate 101 is placed juxtaposed, as close as possible to the one or more sidewalls 112. Preferably, the substrate 101 is in direct contact to at least one sidewall 112. If two sidewalls 112 are used, the cavity length has preferably the same length as the substrate 101 with a small surplus to be able to place the substrate 101. This difference between the cavity length and the substrate length is preferably below 1 mm, more preferably below 500 micron, most preferably below 200 micron. In each of these cases the cavity length is longer compared to the substrate length.

Figure 6:
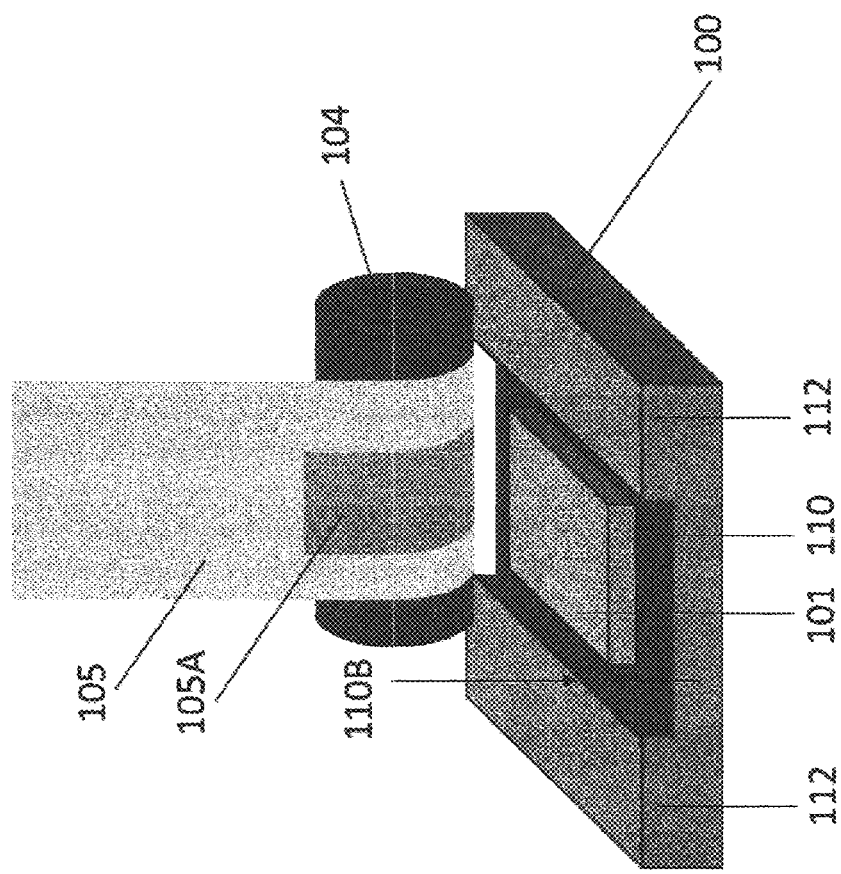
FIG. 6 shows schematically a plate carrier comprising a cavity in pocket form.

The width of roller 104 is typically larger than the substrate 101. Therefore, the cavity 110, present within the two sidewalls 112, as shown in FIG. 5 can also be 90 degree rotated. This is shown in FIG. 6. Due to the upstanding sides 112 of the carrier 100 the imprint gap will be constant during the imprint process. The length of the sidewalls 112 are preferably longer than the length of the substrate 101, where preferably the substrate 101 is placed in the middle of a sidewall 112. The imprint steps at the start and end of the substrate 101 will be strongly reduced. For substrates 101 with a constant width, this will result in a uniform pressure over the entire imprint area, including start and end of the substrate 101. Note that due to the soft roller 104, there will be a small imprint step. This small imprint step can be compensated by also using sidewalls 112 at the front and end of the substrate 101. If the width of the flexible master 105 is larger than the width of the cavity 110, the cavity height 110B should be the same as the substrate thickness (substrate height), preferably with a variation below 200 micron, more preferably below 100 micron, most preferable below 50 micron. If the width of the flexible master 105 is smaller than the width of the cavity 110, and is positioned within the cavity 110, the cavity height 110B should be the same as the sum of the substrate 101 thickness and the flexible master 105 thickness.

Note that in both the imprint process shown in FIG. 5 and both Figures 5and 6B more substrates can be imprinted in the same imprint cycle. If the cavity 110 is either broad or long enough, multiple substrates can be placed aside. In this case the width of the roller 104 should be larger than the cavity 110. The flexible stamp should cover at least both substrates. The flexible stamp 105 can have multiple imprint patterns 105A, which are aligned with the position of the substrates 101. Or the flexible stamp can have one large imprint pattern 105A covering the substrate positions 101.

Figure 6B:
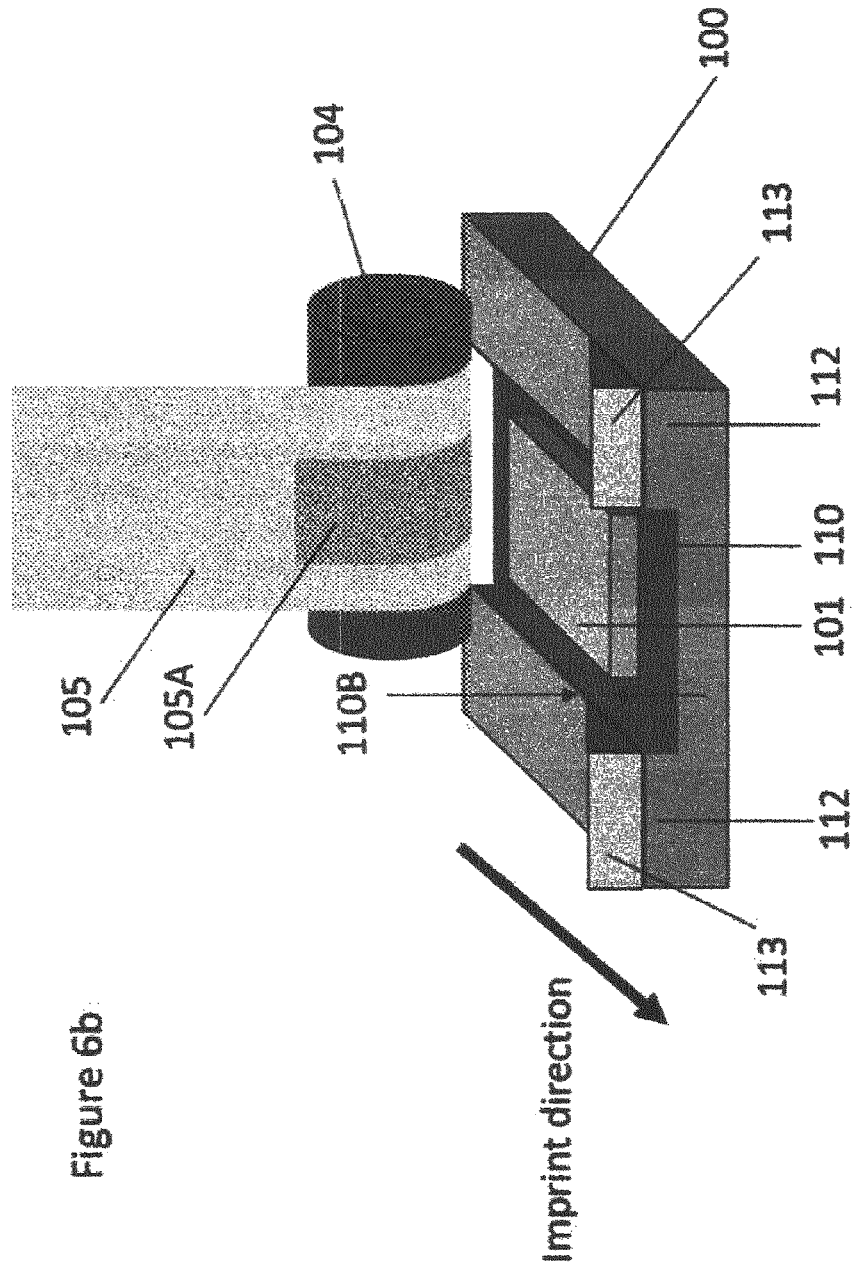
FIG. 6B shows schematically a plate carrier comprising a cavity in pocket form with raised side-wall-ends.

FIG. 6B shows a similar imprint setup. At the end of the imprint process, typically near the end of the substrate 101, the height of the upstanding side wall-ends 113, placed at the side walls 112 of the plate carrier 100 is increased with a bump. Due to this bump the cavity height 110B will be higher. Due to this higher imprint gap, the pressure will be lowered at the end of the imprint process. Due to the low imprint pressure at the end, the resin overflow will be prevented. With such a bump, it can be further assured that an overflow of resin will be maintained within the substrate surface, not contaminating the plate carrier 100. The side wall-end 113 does not necessarily has to be placed at the end of the side walls 112. The positioning depends on the position of the substrate 101 and the end of the imprint process. Therefore, the side wall ends 113 can also be placed in the middle of the plate carrier 110. The side walls-ends 113 can have different forms. According to FIG. 6B the side walls-ends have a wedge form. However, also a block form, a bridge form or ski-jump form is preferred.

Figure 7A:
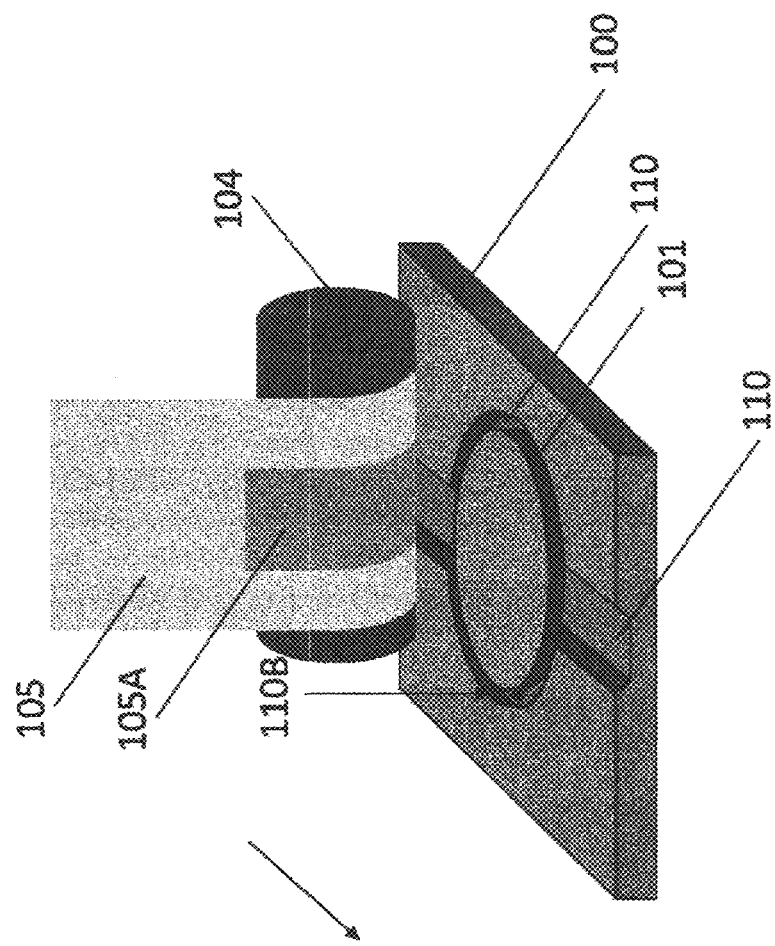
FIG. 7A shows schematically a plate carrier comprising a round cavity.

For substrates with a varying width, the pressure can be made uniform by adopting the cavity 110 to the shape of the substrate 101. An example is shown in FIG. 7A, which shows a round cavity 110 suitable for imprinting on a round substrate 101. In practice the cavity 110 will be slightly wider, to ensure easy loading and unloading in the plate carrier 100. The margin in width is preferably below 2 mm (1 mm at each side), more preferably below 1 mm and most preferably below 400 micron. The cavity height 110B is same as the substrate height. The cavity 110 comprises a kind of groove, in the embodiment of FIG. 7A the groove extends in imprinting direction. Due to this groove parts of the round substrate are not enclosed by the cavity 110. The groove can enable substrate easy loading and unloading. In addition, a kind of liquid can flow along the groove and can support the substrate 101 during the imprinting process or supports the handling features of insertion or removal of the substrate 101.

Figure 7B:
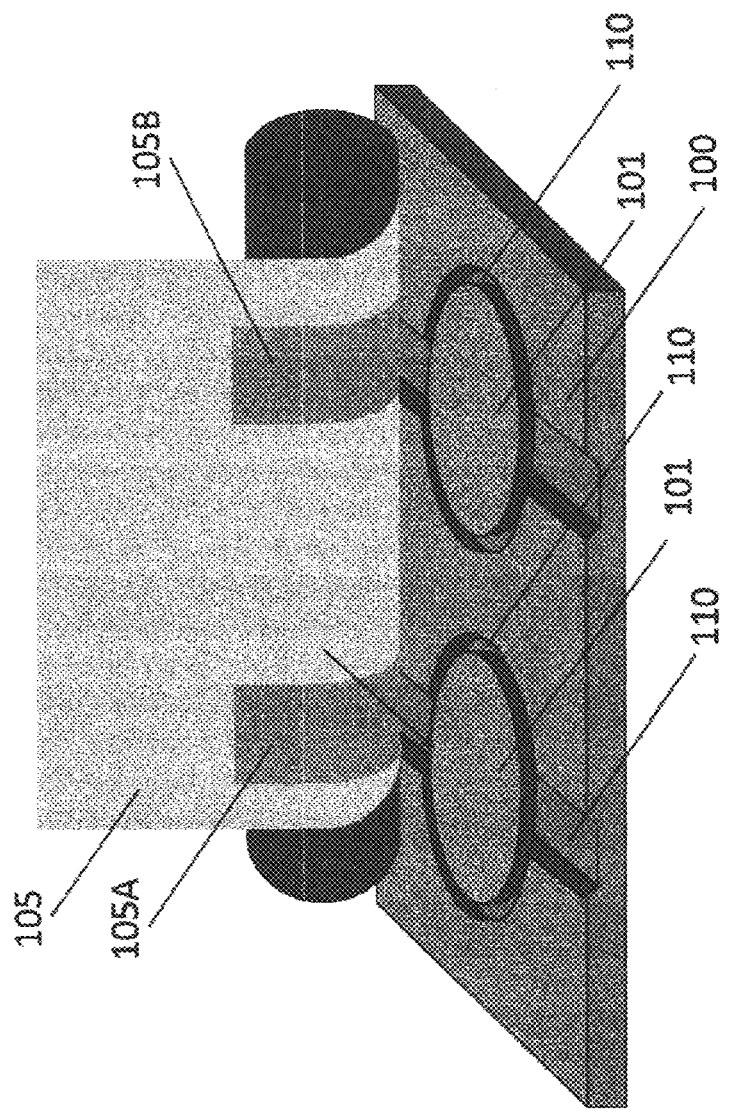
FIG. 7B shows schematically a plate carrier comprising two round cavities.

Note that in FIG. 7A one cavity is shown. But it can also be multiple cavities as shown in FIG. 7B. By use of a larger imprint system and larger flexible stamp, two or more substrates 101 can be imprinted in the same imprint cycle. Hereby the throughput is increased. In this case the flexible stamp 105 should either have multiple imprinting patterns 105A and 105B. The location of these imprinting patterns 105A and 1105B are aligned to the position of the substrates 101 in the carrier 100. The flexible stamp 105 can also have one large imprint pattern covering both the substrates 101 positions on the carrier 100.

Figure 8:
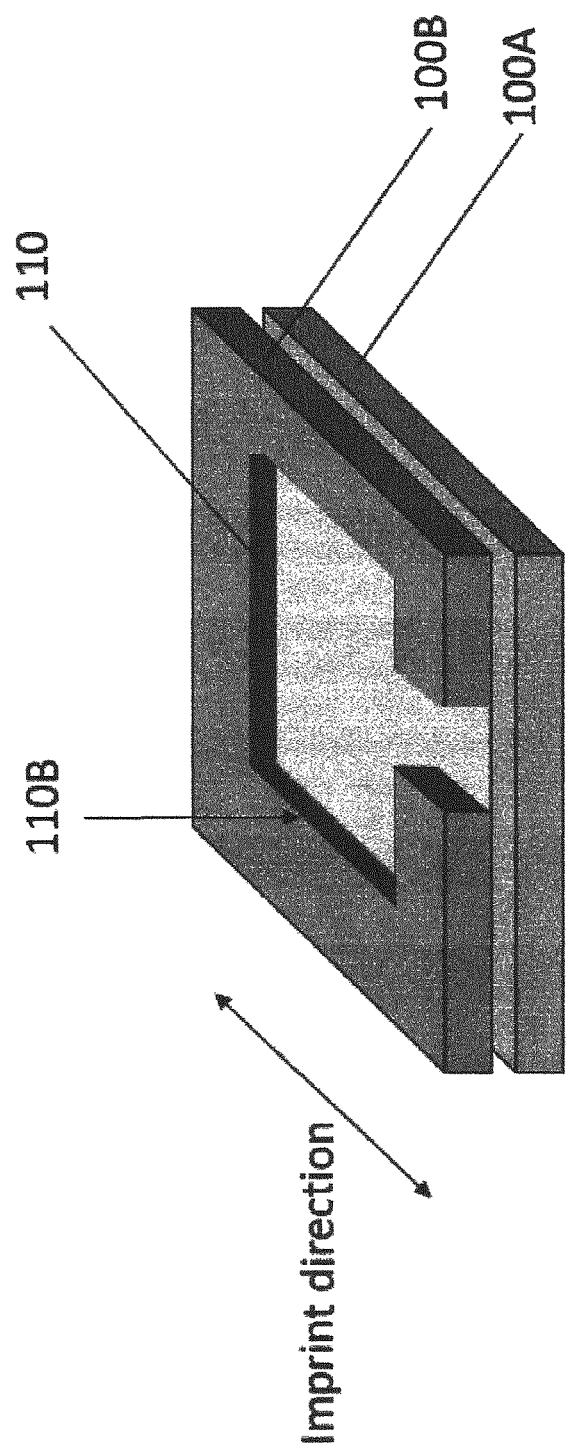
FIG. 8 shows schematically a plate carrier comprising a first and a second part.

In FIG. 8 a plate carrier 100 made of a first plate carrier part 100A and a second plate carrier part 100B is shown. The second plate carrier part 100B comprises the cavity 110. The first plate carrier part 100A and the second plate carrier part 100B are reversibly connectable to each other. Due to this a variable cavity height 110B is creatable and the same base carrier material (first part 100A) is usable for different substrate heights. The materials of the first and second plate carrier part 100A and 100B can be the same or can be different. For example, the material can be glass or a metal layer. The mounting of second plate carrier part 100B can be done, as example, by use of upstanding positioning pins on the first plate carrier part 100A and positioning holes at the second plate carrier part 100B.

In a preferred embodiment the plate carrier 100 in FIG. 8 has a first plate carrier part 100A which is rigid and a second plate carrier part 100B which is flexible as a compensating material. As example the second plate carrier part 100B can be made of rubber or plastic sheets. If the backside of the substrate 101 is not uniformly flat due to defects or thickness variations, there will be pressure variations during imprinting. This will result in a locally thinner residual layer thickness of the resin 102. A non-uniform residual layer will be visible at the frontside of the imprinted product. With the second plate carrier part 100B being made of a flexible material, this effect can be avoided or reduced. In a second example, the first plate carrier 100A has an integrated fluid flow system to create either an air bed by use of air flow system, or a liquid bed by use of liquid flow system (a compensating material). The cushion of air or liquid, underneath the substrate 101 (not shown in FIG. 8), functions as a non-uniformity compensating layer.

Figure 9:
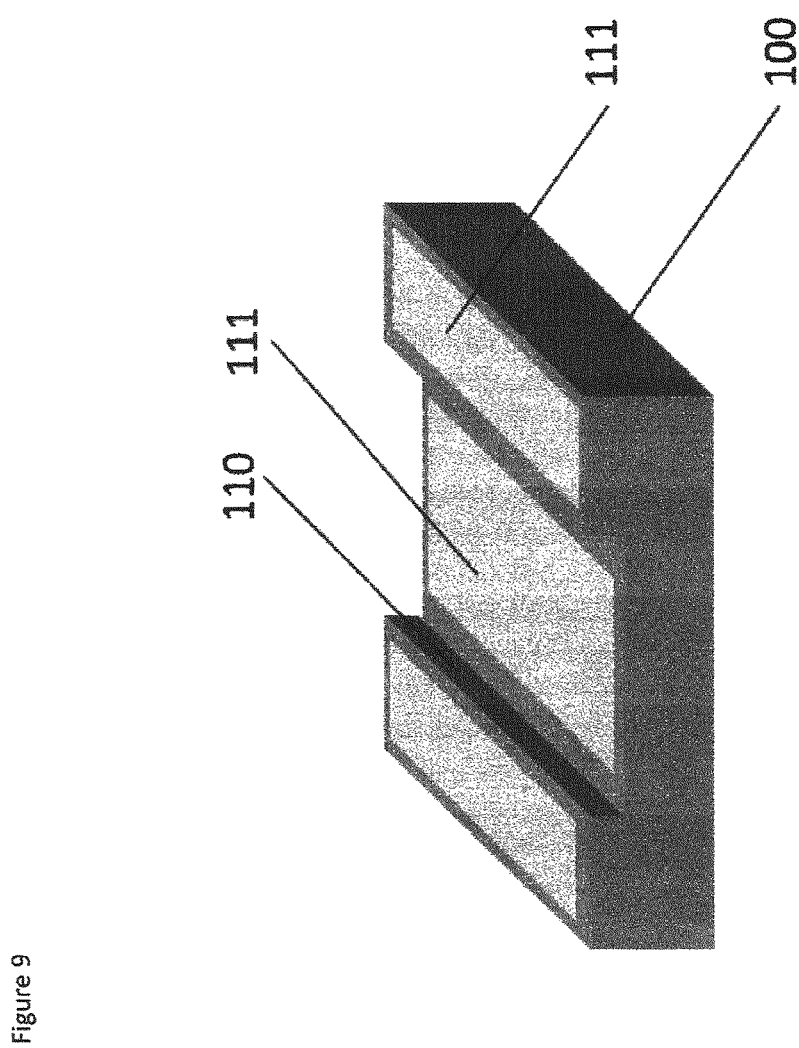
FIG. 9 shows schematically a plate carrier comprising a flexible material.

In FIG. 9 the plate carrier 100 comprises a cavity 110, whereby a flexible material 111 as one example for a compensating material is located inside of the cavity 110 as well as on the upper sides of the plate carrier 100. Due to the use of a flexible material 111 the impact of defects underneath the substrate 100 or layer thickness non-uniformities resulting in pressure variations and consequent imprint variations can be avoided or reduced.

The invention claimed is:

1. Imprinting apparatus for a roll-to-plate process comprising a flexible master (105), a plate carrier (100) and a substrate (100), whereby the flexible master (105) is pressable upon the substrate (100) during the imprinting process and the plate carrier (100) comprises at least one substrate (101), whereby the plate carrier (100) has at least one cavity (110) wherein the at least one substrate (101) is located characterized in that at least one substrate side-face is at least partially unenclosed by the cavity (110).

2. Imprinting apparatus according to claim 1, whereby the at least one cavity (110) has a height (110A) which is approximately equal to sum of the substrate (101) thickness and a curable resin thickness (102) onto the substrate (101).

3. Imprinting apparatus according to claim 1, whereby the at least one cavity (110) has a height (110A) which is approximately equal to or lower than the sum of the substrate thickness and the thickness of the flexible master (105).

4. Imprinting apparatus according to claim 1, whereby the plate carrier (100) comprises a compensating material (111).

5. Imprinting apparatus according to claim 4, whereby the cavity (110) is located within the compensating material (111) or the compensating material (111) is in the at least one cavity located.

6. Imprinting apparatus according to claim 1, whereby the plate carrier (100) and the cavity (110) is made of one piece.

7. Imprinting apparatus according to claim 1, whereby the plate carrier (100) is made of at least two parts (100A, 100B).

8. Imprinting apparatus according to claim 7, whereby the at least two parts (100A, 100B) of the plate carrier (100) are reversibly connectable with each other.

9. Imprinting apparatus according to claim 7, whereby at least one of the two parts (100A, 100B) of the plate carrier (100) is made of the compensating material (111).

10. Imprinting apparatus according to claim 4, whereby the compensating material is a flexible material (111), whereby the flexible material has a Young's Modulus between 0.1 Giga Pascal (GPa) and 10 Giga Pascal (GPa), especially preferred between 0.5 Giga Pascal (GPa) and 5 Giga Pascal (GPa, measured according to ASTM E111.

11. Imprinting apparatus according to claim 1, whereby a fluid flow system is located within the cavity (110) of the plate carrier (100).

12. Imprinting apparatus according to claim 1, whereby the plate carrier (100) comprises a placement system for the substrate (101).

13. Imprinting apparatus according to claim 1, whereby the form of the cavity (110) is equal to the form of the substrate (101).

14. Imprinting apparatus according to claim 1, whereby substrate (101) and/or the plate carrier (100) have/has at least one raised side wall (112), whereby at least one raised side wall (112) has a raised side wall ends (113).

15. Roll-to-plate process, whereby a substrate (101) is located within a cavity (110) of the substrate (101) and a flexible master (105) is pressed on the substrate (101), whereby the cavity height (110B) is adapted to match the height of the substrate (101) and/or to match the height of the flexible master (105) in combination with the height of the substrate, whereby the substrate (101) is located within the cavity (110) in such a way that at least one substrate side-face of the substrate is at least partially unenclosed by the cavity (110).

* * * * *